United States Patent [19]

Parkinson et al.

[11] 4,223,238

[45] Sep. 16, 1980

[54] INTEGRATED CIRCUIT SUBSTRATE CHARGE PUMP

[75] Inventors: Ward D. Parkinson, Dallas, Tex.; Walter C. Seelbach, Scottsdale, Ariz.

[73] Assignee: Motorola, Inc., Schaumburg, Ill.

[21] Appl. No.: 934,642

[22] Filed: Aug. 17, 1978

[51] Int. Cl.[2] .......... H03K 1/02; H03K 1/12; H03K 3/64; H03K 3/26

[52] U.S. Cl. .......... 307/297; 307/200 A; 307/237; 307/285; 307/303

[58] Field of Search .......... 307/200 A, 253, 254, 307/255, 256, 285, 296, 297, 299 R, 237, 303, 264

[56] References Cited

U.S. PATENT DOCUMENTS

| | | | |
|---|---|---|---|
| T954,006 | 1/1977 | Lee et al. | 307/304 |
| 3,509,446 | 4/1970 | Mullaly | 307/303 X |
| 3,609,414 | 9/1971 | Pleshko et al. | 307/303 X |
| 3,750,018 | 7/1973 | Leone et al. | 307/297 X |
| 3,794,862 | 2/1974 | Jenne | 307/304 |
| 3,806,741 | 4/1974 | Smith | 307/304 |
| 4,024,417 | 5/1977 | Heuber et al. | 307/303 |
| 4,028,564 | 6/1977 | Streit et al. | 307/303 X |
| 4,049,980 | 9/1977 | Maitland | 307/297 X |
| 4,115,710 | 9/1978 | Lou | 307/304 |
| 4,142,114 | 2/1979 | Green | 307/297 X |

OTHER PUBLICATIONS

Frantz, "Threshold Voltage Control for N-Channel MOSFET Devices", *IBM Tech. Discl. Bull.*, vol. 12, No. 12, p. 2078, 5/1970.

Dickson "On Chip High-Voltage Generation in MNOS IC using an Improved Voltage Multiplier Technique"; *IEEE-JSSC*, vol. SC-11, No. 3, pp. 374-378; 6/1976.

*Primary Examiner*—Larry N. Anagnos

*Attorney, Agent, or Firm*—Vincent B. Ingrassia

[57] ABSTRACT

An integrated circuit is disclosed which includes a charge pump adapted for biasing the substrate of a monolithic integrated circuit containing bipolar transistors. An oscillator operating under the control of a control input provides pulsed output signals for driving a diode-capacitor voltage multiplier network which generates a substrate bias voltage. A feedback network including a zener diode senses the substrate voltage, and switching action of the zener diode operates to selectively enable and disable the oscillator for regulating the substrate bias voltage.

7 Claims, 2 Drawing Figures

INTEGRATED CIRCUIT SUBSTRATE CHARGE PUMP

BACKGROUND OF THE INVENTION

1. Field of the Invention

This invention relates generally to monolithic integrated circuits and more particularly to a charge pump circuit for biasing the substrate of an integrated circuit.

2. Description of the Prior Art

Integrated circuits including a substrate within which a plurality of bipolar transistors are fabricated are well known in the art. Typically the substrate is a P-type semiconductor material having an upper surface upon which an N-type epitaxial semiconductor layer is deposited. Typically, individual epitaxial islands are isolated from one another by diffusing a P-type dopant through an appropriate mask into the upper surface of the epitaxial layer. The P-type dopant diffuses through the epitaxial layer and contacts the underlying P-type substrate. Circuit components, such as transistors and resistors are typically fabricated within one or more of the isolated epitaxial islands. In order to prevent electrical coupling between one epitaxial island and another, the P-type substrate material is usually biased with the most negative circuit voltage such that the epitaxial-substrate semiconductor junction is maintained in reverse bias. For example, if the circuit includes power supply conductors for receiving voltages of +5 volts and 0 volts, the substrate is typically biased with 0 volts. The reverse biased epitaxial-substrate semiconductor junction forms a depletion region capacitance, also known as a space-charge or barrier capacitance. The thickness of the space-charge layer at the junction increases with reverse voltage. For a more detailed description of this phenomenon, see "Fundamentals of Semiconductor Devices" by Lindmayer and Wrigley, Van Nostrand, Reinhold Co., 1965.

In many bipolar circuit families, such as transistor-transistor logic (TTL) and emitter-coupled logic (ECL), an isolated epitaxial region may form the collector of a bipolar switching transistor, and the collector voltage varies as the transistor is switched between its ON and OFF states. The depletion capacitance associated with the epitaxial-substrate junction limits the speed of voltage transitions at the collector of each switching transistor, thereby limiting the overall bandwidth of a digital circuit.

Increasing the amount of reverse bias across the epitaxial-substrate junction decreases the amount of depletion capacitance associated with the junction. One method of increasing the amount of reverse bias across the epitaxial-substrate junction is to couple a third power supply terminal to the integrated circuit for applying a more negative potential to the P-type substrate. However, this technique has the disadvantage of requiring an extra power supply and an extra input terminal.

MOSFET integrated circuits are known which employ circuitry for biasing the substrate to a more negative potential without the use of a separate external power supply. However, for integrated circuits which employ bipolar transistors, it is necessary to carefully regulate the substrate bias voltage since too negative a substrate bias voltage will cause excessive leakage or even breakdown across the epitaxial-substrate junction. Thus, the substrate bias voltage must be regulated so as to strike an optimum balance between improved speed (associated with lesser collector-substrate capacitance for switching transistors) and increased leakage (associated with a larger reverse bias and the likelihood of defects in the semiconductor material). Also, negative going noise spikes must be prevented from being coupled to the substrate; therefore, the circuit for regulating the substrate voltage should have the ability to clamp the substrate voltage from becoming too negative.

Prior art MOSFET circuits are known which employ a source-body effect variation in the threshold of one or more MOSFET devices to sense the substrate bias voltage. However, the threshold voltage of a MOSFET device varies widely with processing variations and would be poorly suited for regulating the substrate bias voltage of a bipolar integrated circuit in which leakages can significantly harm circuit performance. In order for the substrate bias circuitry to respond quickly, this circuitry should be designed to be potentially capable of charging the substrate to a Thevenin equivalent voltage which is well below the desired bias voltage. The regulation of the actual bias voltage must therefore be closely controlled to prevent the charging circuitry from actually reaching the Thevenin equivalent voltage and biasing the substrate at too negative a voltage. Thus, it will be appreciated that a circuit which increases the amount of reverse bias across the epitaxial-substrate junction for decreasing the associated depletion capacitance and improving the speed-power product of a bipolar integrated circuit while preventing the magnitude of the substrate bias voltage from becoming so large as to degrade circuit performance is a significant improvement over prior art bipolar integrated circuits.

SUMMARY OF THE INVENTION

It is an object of the present invention to decrease the depletion capacitance associated with an epitaxial-substrate junction of a bipolar integrated circuit.

Another object of the present invention is to provide a charge pump circuit for establishing a substrate bias voltage which increases the amount of reverse bias across an epitaxial-substrate junction of a bipolar integrated circuit.

It is also an object of the present invention to regulate the magnitude of the substrate bias voltage provided by the charge pump circuit to limit the amount of reverse bias established across the epitaxial-substrate junction so as to prevent the junction from conducting excessive leakage currents.

In accordance with the these and other objects, the present invention relates to an integrated circuit having a substrate and including a first circuit having a control input and providing at least one output signal, a second circuit responsive to the at least one output signal for applying a substrate bias voltage to the substrate of the integrated circuit, and sensing circuitry which includes a zener diode responsive to the substrate bias voltage for enabling and disabling the first circuitry in order to regulate the substrate bias voltage. In the preferred embodiment of the invention, the sensing circuitry includes a zener diode which is coupled to the substrate and which exhibits a breakdown characteristic when the magnitude of the substrate bias voltage exceeds a desired limit. In the preferred embodiment, the first circuitry referred to above is an oscillator for providing true and complement oscillating voltages and the second circuit referred to above is a diode-capacitance network responsive to the oscillating voltages for generating the substrate bias voltage. When the zener diode breaks down, the oscillator is disabled and the charge pump ceases to operate. The zener diode is operative to clamp the substrate relative to ground potential so as to limit the magnitude of the substrate bias voltage.

DESCRIPTION OF THE PREFERRED EMBODIMENT

Figure 1:
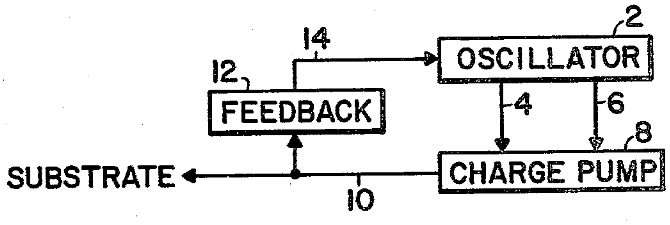
FIG. 1 is a block diagram of a preferred embodiment of the invention including an oscillator, a charge pump, and a feedback circuit.

In FIG. 1 a preferred embodiment of the invention is shown in block diagram form. Oscillator 2 provides true and complement oscillating output signals to conductors 4 and 6, respectively. Conductors 4 and 6 are coupled to charge pump circuit 8 for actively driving charge pump 8. The output of charge pump 8 is coupled to the integrated circuit substrate by conductor 10 for pumping negative charge into the integrated circuit substrate. Feedback circuit 12 is also coupled to the substrate for sensing the substrate bias voltage and for providing a control signal on conductor 14 for coupling to a control input of oscillator 2. When the magnitude of the substrate bias voltage exceeds a desired limit, the control signal output to conductor 14 is switched so as to disable oscillator 2. The true and complement outputs provided by oscillator 2 then assume a predetermined voltage such that charge pump 8 is no longer actively driven. The magnitude of the substrate bias voltage then decreases until feedback circuit 12 again enables oscillator 2. This procedure is repeated periodically so as to maintain the substrate bias voltage at a desired point.

Figure 2:
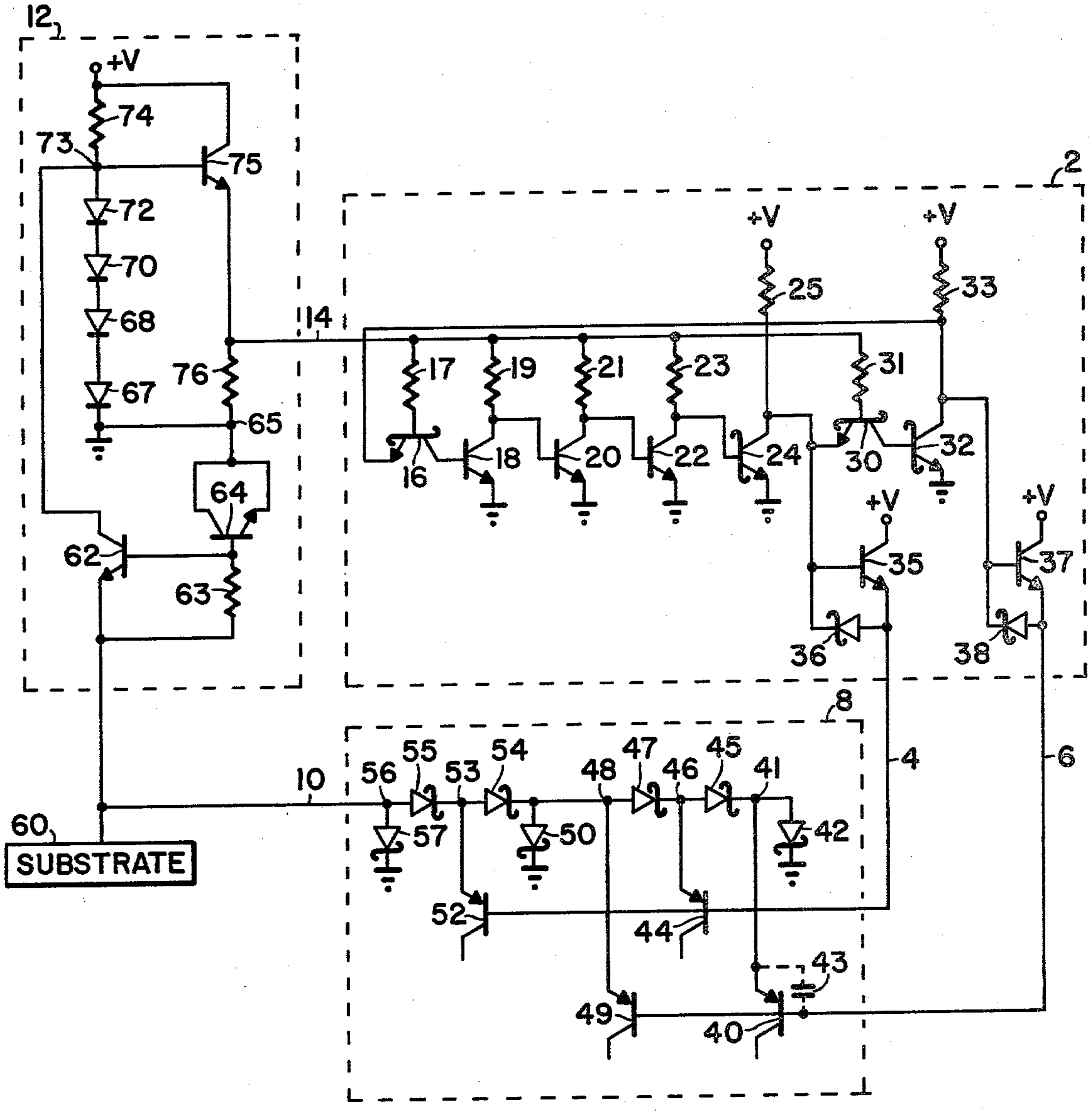
FIG. 2. is a detailed circuit schematic of the embodiment of the invention shown in FIG. 1.

In FIG. 2 the circuitry is shown for implementing the preferred embodiment of the invention illustrated in block diagram form in FIG. 1. An oscillator is formed within dashed block 2 for providing true and complement output signals to conductors 4 and 6. Common-base connected Schottky-clamped transistor 16 has its base terminal coupled to conductor 14 by resistor 17. The collector of transistor 16 is coupled to the base terminal of common-emitter connected transistor 18. The collector of transistor 18 is coupled to conductor 14 by resistor 19, and the collector of transistor 18 is also coupled to the base of transistor 20. The collector of transistor 20 is coupled to conductor 14 by resistor 21, and the collector of transistor 20 is also coupled to the base terminal of transistor 22. Similarly, the collector of transistor 22 is coupled to conductor 14 by resistor 23, and the collector of transistor 22 is also coupled to the base input of Schottky-clamped transistor 24. The emitter terminals of transistors 18, 20, 22, and 24 are all coupled to ground potential. Transistors 18, 20, and 22 can also be formed as Schottky-clamped transistors, but the output signals provided by oscillator 2 will then exhibit a shorter pulse width since the delay associated with transistors 18, 20 and 22 will be smaller.

The collector of transistor 24 is coupled to a positive voltage supply terminal by resistor 25, and the collector of transistor 24 is also coupled to the emitter of common-base connected Schottky-clamped transistor 30. The base terminal of transistor 30 is coupled to conductor 14 by resistor 31, and the collector of transistor 30 is coupled to the base terminal of Schottky-clamped transistor 32. The emitter terminal of transistor 32 is coupled to ground potential, and the collector terminal of transistor 32 is coupled to the positive supply terminal by resistor 33. The collector of transistor 32 is also fedback to the emitter of transistor 16 for causing oscillation.

Emitter-follower transistors 35 and 37 provide true and complement output signals to conductors 4 and 6 for driving charge pump circuit 8. Transistor 35 has its base terminal coupled to the collector of transistor 24, its collector terminal coupled to the positive voltage supply terminal, and its emitter coupled to conductor 4. Transistor 37 has its base terminal coupled to the collector of transistor 32, its collector terminal coupled to the positive voltage supply terminal, and its emitter coupled to conductor 6. Schottky diodes 36 and 38 are coupled across the emitter-base junctions of transistors 35 and 37, respectively, and actively pull conductors 4 and 6 toward ground potential when the collectors of transistors 24 and 32, respectively, are conducting. When transistors 24 and 32 are not conducting, then conductors 4 and 6 are pulled up by transistors 35 and 37 to within approximately one base-emitter junction voltage below the positive supply voltage.

Oscillator 2 is controlled by a voltage applied to conductor 14 by feedback circuit 12 such that oscillator 2 is enabled when the voltage on conductor 14 is two or more junction voltages above ground potential, and such that oscillator 2 is disabled when the voltage on conductor 14 is near ground potential or at a more negative voltage. When oscillator 2 is disabled, transistors 24 and 32 are both OFF, and conductors 4 and 6 are both driven to a high level.

The charge pump circuit within dashed block 8 in FIG. 2 receives the output signals present on conductors 4 and 6, and generates a negative voltage on conductor 10 for biasing a substrate, shown as block 60 in FIG. 2 for the ease of illustration. Conductor 4 is coupled to the base terminals of PNP transistors 44 and 52 while conductor 6 is coupled to the base terminals of PNP transistors 40 and 49. The emitter-base junction of each of the transistors 40, 44, 49 and 52 is used to provide a capacitance. As is well known in the art, transistor 40 may comprise a P-type base region diffused into an isolated N-type epitaxial layer disposed upon a P-type substrate. The P-type base diffusion region corresponds to the emitter of transistor 40, the N-type isolated epitaxial layer corresponds to the base region of transistor 40, and the P-type substrate corresponds to the collector of transistor 40. The capacitance associated with the reverse-biased emitter-base junction of transistor 40 is shown symbolically in FIG. 2 by capacitor 43. Transistor 40 should be fabricated so as to maximize the capacitance between conductor 6 and node 41 while minimizing any stray capacitance to other points within the integrated circuit.

The emitter of transistor 40 is coupled to node 41, and Schottky diode 42 is coupled between node 41 and ground potential. The emitter of transistor 44 is coupled to node 46, and Schottky diode 45 is coupled from node 46 to node 41. The emitter of transistor 49 is coupled to node 48, and Schottky diode 47 is coupled from node 48 to node 46. Schottky diode 50 is coupled from node 48 to ground potential. The emitter of transistor 52 is coupled to node 53, and Schottky diode 54 is coupled from node 53 to node 48. Schottky diode 55 is coupled from node 56 to node 53, and Schottky diode 57 is coupled from node 56 to ground potential. Node 56 is coupled by conductor 10 to substrate 60. Schottky diode 57 prevents the substrate voltage from initially floating more than a Schottky diode forward voltage above ground potential before the charge pump circuit 8 has had sufficient time to bias the substrate to the desired negative bias voltage.

Diodes 42, 45, 47, 54, and 55 are shown as Schottky diodes in FIG. 2, it being understood that conventional P-N semiconductor junction diodes could also be used for these elements. However, Schottky diodes were found to have higher breakdown voltage characteristics and lower forward voltages than semiconductor junction diodes in a particular application of the invention. Also, Schottky diodes were found to have less forward conducting capacitance than P-N semiconductor junction diodes such that less charge is required to turn the Schottky diodes on and off. It will also be appreciated that the Schottky diodes operate more efficiently in a bipolar integrated circuit charge pump than do diode-connected MOSFET devices in a MOSFET integrated circuit charge pump since the threshold drop across diode-connected MOSFET devices is subject to the source-body effect. The source-body effect causes the threshold drop to vary depending upon the location of a particular diode-connected MOSFET device within the diode-capacitor network, and larger thresholds decrease the amount of voltage available to charge the capacitors in the diode-capacitor network.

The operation of charge pump circuit 8 will now be described. It will be assumed that oscillator 2 is initially in the state where conductor 6 approaches the positive supply voltage +V and conductor 4 approaches ground potential or 0 volts. During this initial cycle, the emitter-base junction capacitance of transistor 40 couples conductor 6 to ground potential through Schottky diode 42. Thus a charge of roughly +V volts is stored across the emitter-base capacitance of transistor 40 with the base terminal being positively charged relative to the emitter terminal. When oscillator 2 switches states, conductor 4 rises to approximately +V while conductor 6 falls to approximately to ground potential. Node 41 drops from approximately ground potential to approximately −V volts, and Schottky diode 42 turns off. Conductor 4 is coupled by the emitter-base capacitance of transistor 44 and by Schottky diode 45 to node 41. Thus the emitter-base junction capacitance of transistor 44 stores a charge of magnitude 2V volts, the base being positively charged with respect to the emitter. When the oscillator 2 again switches, conductor 6 returns to a high level and conductor 4 returns to a low level. Node 41 is pulled up toward ground potential, but node 46 falls to approximately −2V, thereby making diode 45 reverse biased and non-conductive. Conductor 6 is coupled by the emitter-base capacitance of transistor 49 and by diode 47 to node 46. Thus the emitter-base junction capacitance of transistor 49 is charged to a voltage of magnitude 3V volts, with the base being positively charged with respect to the emitter. Transistor 52 functions in a similar manner such that node 53 switches between −3V volts and −4V volts. Diode 55 couples substrate 60 to the negative potential generated at node 53. Thus, oscillator 2 and charge pump 8 operate to charge substrate 60 towards a negative potential.

Diode 50 functions to speed-up the operation of charge-pump circuit 8. Assuming that several transitions of the voltages on conductors 4 and 6 are required before node 46 is established at a negative voltage, diode 47 will not initially conduct a significant charging current. Thus, diode 50 helps to charge the capacitances associated with transistors 49 and 52 until the voltage at node 46 falls sufficiently negative to allow diode 47 to conduct, at which time diode 50 remains nonconductive.

Feedback circuit 12 includes transistor 62 which has its emitter terminal coupled to substrate 60. Resistor 63 is coupled between the emitter and base terminals of transistor 62. The base terminal of transistor 62 is coupled to the base terminal of zener-diode-connected transistor 64. The emitter and collector terminals of transistor 64 are shorted and coupled to node 65 which in turn is coupled to ground potential. The collector of transistor 62 is coupled to node 73, and resistor 74 couples node 73 to the positive power supply terminal. Also coupled to node 73 is the base terminal of emitter-follower transistor 75 which has its collector terminal coupled to the positive power supply terminal, and its emitter terminal coupled to conductor 14. Resistor 76 is coupled between the emitter of transistor 75 and node 65. Node 73 is also coupled to the anode of diode 72, and the cathode of diode 72 is coupled to the anode of diode 70. The cathode of diode 70 is coupled to the anode of diode 68, and the cathode of diode 68 is coupled to the anode of diode 67. The cathode of diode 67 is coupled to ground potential.

The operation of the feedback circuit will now be described. First it will be assumed that substrate 60 is initially at or near ground potential such that zener diode 64 is in its non-conductive mode. In this event, transistor 62 is OFF and the base of transistor 62 is essentially at the substrate potential since resistor 63 does not conduct any current. Resistor 74 supplies current from the positive supply terminal to series connected diodes 72, 70, 68, and 67 such that node 73 is four P-N junction diode voltages above ground potential. The voltage at node 73 is translated down one base-emitter voltage by transistor 75 such that the voltage applied at conductor 14 is roughly three P-N junction diode voltages above ground potential. This voltage is sufficient to enable oscillator 2 to generate oscillating voltages on conductors 4 and 6.

Oscillator 2 and charge pump 8 eventually charge substrate 60 to a voltage potential of a magnitude which exceeds the breakdown voltage of zener diode 64. When this occurs, zener diode 64 condducts current and clamps the base of transistor 62 to one zener breakdown voltage below ground potential. The current conducted by zener diode 64 allows transistor 62 to become conductive, and the current drawn through resistor 74 by the collector of transistor 62 causes the voltage at the collector of transistor 62 to drop toward the substrate potential as transistor 62 becomes saturated. Diodes 67, 68, 70, and 72 become reverse biased and are maintained nonconductive. The voltage at node 73 thus drops well below ground potential and turns off transistor 75. Therefore the voltage on conductor 14 falls towards ground potential and disables oscillator 2. Oscillator 2 remains disabled until the substrate potential rises toward ground potential and zener diode 64 returns to the non-conductive mode. Thus zener diode 64 acts to regulate the substrate bias voltage applied to substrate 60. Moreover, zener diode 64 in combination with transistor 62 operate to clamp the substrate bias voltage to a maximum negative potential (a zener breakdown voltage plus a base-emitter junction forward voltage) so as to filter any negative going noise spikes.

In a particular application of the invention within a bipolar integrated circuit operating between power supply voltages of +5 volts and zero volts, the substrate bias voltage was maintained near −5 volts which resulted in a 20% improvement in the speed-power product for the logic circuitry fabricated within the integrated circuit.

Zener diode 64 is easily fabricated with standard semiconductor wafer processing techniques which generally provide a step junction at the emitter-base interface for providing a sharply defined breakdown curve.

While the invention has been described with reference to a preferred embodiment, the description is for illustrative purposes and is not to be construed as limiting the scope of the invention. For example, the invention may be adapted for integrated circuits employing an N-type substrate by reversing the polarity of the Schottky diode and P-N junction capacitors in charge pump 8 so as to generate a positive voltage. Also, the circuit shown in FIG. 2 could be modified to include a second charge pump circuit for charging the substrate to a positive potential such that the first charge pump circuit is enabled when zener diode 64 is non-conductive, and the second charge pump circuit is enabled when zener diode 64 is in the breakdown mode. Various modifications and changes may occur to those skilled in the art without departing from the true spirit and scope of the invention as defined as the appended claims.

What is claimed is:

1. An integrated circuit including a substrate comprising:

(a) first means for providing at least one output signal, such first means including a control input for controlling said first means, (b) second means coupled to said first means and responsive to at least one output signal for providing a substrate bias voltage at an output terminal, the output terminal being coupled to the substrate for applying the substrate bias voltage to the substrate, and (c) feedback means coupled to the substrate and to said first means for sensing the substrate bias voltage and for providing enabling and disabling signals to the control input for selectively enabling and disabling said first means, said feedback means including a zener diode responsive to the substrate bias voltage having a non-conductive mode and a breakdown mode, and switching means responsive to said zener diode for applying said enabling signal to aid control input when said zener diode is in said nonconductive mode and for applying said disabling signal to said control input when said zener diode is in said breakdown mode.

2. An integrated circuit as recited in claim 1 wherein the control signal is in a first state for enabling said first means when said zener diode is in the nonconductive mode, and the control signal is in a second state for disabling said first means when said zener diode is in the breakdown mode.

3. An integrated circuit as recited in claim 1 wherein the integrated circuit further comprises first and second power supply conductors suitable for conducting first and second power supply voltages, respectively, the substrate bias voltage being outside a range of voltages defined by the first and second power supply voltages.

4. An integrated circuit as recited in claim 1 wherein said first means comprises an oscillator for providing the at least one output signal as an oscillating voltage when said first means is enabled and for providing the at least one output signal as a predetermined voltage when said first means is disabled.

5. An integrated circuit including a substrate, the integrated circuit including at least one bipolar transistor disposed uon the substrate, the at least one bipolar transistor and the substrate forming a junction having a depletion capacitance, the integrated circuit comprising:

(a) an oscillator for providing at least one output signal, (b) a diode-capacitance network coupled to said oscillator and responsive to the at least one output signal for applying a substrate bias voltage to the substrate, and (c) feedback means coupled to said oscillator and being responsive to the substrate bias voltage for providing enabling and disabling signals to said oscillator and for regulating the substrate bias voltage, said feedback means including a zener diode responsive to the substrate bias voltage having a nonconductive mode and a breakdown mode, and switching means responsive to said zener diodes for applying said enabling signal to said oscillator when said zener diode is in said nonconductive mode and for applying said disabling signal to said oscillator when said zener diode is in said breakdown mode.

6. An integrated circuit as recited in claim 5 wherein the integrated circuit is operative to reduce the depletion capacitance of the junction formed by the substrate and the at least one bipolar transistor.

7. An integrated circuit as recited in claim 5 further comprising first and second power supply conductors suitable for conducting first and second power supply voltages, respectively, the substrate bias voltage being outside a range of voltages defined by the first and second power supply voltages such that the junction formed by the at least one bipolar transistor and the substrate is maintained in reverse bias and such that the depletion capacitance of the junction is reduced.

* * * * *